(12) United States Patent
Ahmed et al.

(10) Patent No.: US 7,041,542 B2
(45) Date of Patent: May 9, 2006

(54) DAMASCENE TRI-GATE FINFET

(75) Inventors: Shibly S. Ahmed, San Jose, CA (US); Haihong Wang, Milpitas, CA (US); Bin Yu, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 50 days.

(21) Appl. No.: 10/754,559

(22) Filed: Jan. 12, 2004

(65) Prior Publication Data

US 2005/0153492 A1    Jul. 14, 2005

(51) Int. Cl.
 *H01L 21/338* (2006.01)
(52) U.S. Cl. ........................ 438/183; 438/149; 257/213
(58) Field of Classification Search ................ None
See application file for complete search history.

(56) References Cited

U.S. PATENT DOCUMENTS

| | | | | |
|---|---|---|---|---|
| 5,801,397 | A | 9/1998 | Cunningham | 257/66 |
| 5,960,270 | A | 9/1999 | Misra et al. | 438/197 |
| 6,265,256 | B1 | 7/2001 | An et al. | 438/201 |
| 6,303,447 | B1 | 10/2001 | Chhagan et al. | 438/299 |
| 6,342,410 | B1 | 1/2002 | Yu | 438/164 |
| 6,396,108 | B1 | 5/2002 | Krivokapic et al. | 257/365 |
| 6,406,951 | B1 * | 6/2002 | Yu | 438/183 |
| 6,413,802 | B1 | 7/2002 | Hu et al. | 438/151 |
| 6,458,662 | B1 | 10/2002 | Yu | 438/286 |
| 6,465,823 | B1 | 10/2002 | Yagishita et al. | 257/288 |
| 6,475,890 | B1 | 11/2002 | Yu | 438/574 |
| 6,509,611 | B1 | 1/2003 | Park et al. | 257/330 |
| 6,515,320 | B1 | 2/2003 | Azuma et al. | 257/288 |
| 6,525,403 | B1 | 2/2003 | Inaba et al. | 257/618 |
| 6,551,885 | B1 | 4/2003 | Yu | 438/300 |
| 6,551,886 | B1 | 4/2003 | Yu | 438/300 |
| 6,562,665 | B1 | 5/2003 | Yu | 438/149 |
| 6,583,469 | B1 | 6/2003 | Fried et al. | 257/329 |
| 6,645,797 | B1 | 11/2003 | Buynoski et al. | 438/157 |
| 6,764,884 | B1 * | 7/2004 | Yu et al. | 438/157 |
| 6,765,303 | B1 | 7/2004 | Krivokapic et al. | 257/903 |
| 6,855,990 | B1 | 2/2005 | Yeo et al. | 257/353 |

(Continued)

FOREIGN PATENT DOCUMENTS

EP    1 383 164 A1    1/2004

(Continued)

OTHER PUBLICATIONS

Copy of International Search Report dated Mar. 4, 2005.
Digh Hisamoto et al., "FinFET—A Self-Aligned Double-Gate MOSFET Scalable to 20 nm," IEEE Transactions on Electron Devices, vol. 47, No. 12, Dec. 2000, pp. 2320-2325.

(Continued)

*Primary Examiner*—Thao P. Le
(74) *Attorney, Agent, or Firm*—Harrity Snyder, LLP

(57) ABSTRACT

A method of forming a fin field effect transistor includes forming a fin and forming a source region adjacent a first end of the fin and a drain region adjacent a second end of the fin. The method further includes forming a dummy gate over the fin and forming a dielectric layer around the dummy gate. The method also includes removing the dummy gate to form a trench in the dielectric layer and forming a metal gate in the trench.

16 Claims, 13 Drawing Sheets

U.S. PATENT DOCUMENTS

| | | | |
|---|---|---|---|
| 2002/0153587 A1 | 10/2002 | Adkisson et al. | 257/510 |
| 2002/0177263 A1 | 11/2002 | Hanafi et al. | 438/183 |
| 2003/0111686 A1 | 6/2003 | Nowak | 257/328 |
| 2003/0113970 A1 | 6/2003 | Fried et al. | 438/286 |
| 2003/0141525 A1 | 7/2003 | Nowak | 257/288 |
| 2003/0151077 A1 | 8/2003 | Mathew et al. | 257/250 |
| 2005/0104091 A1* | 5/2005 | Tabery et al. | 257/213 |

FOREIGN PATENT DOCUMENTS

| | | |
|---|---|---|
| WO | WO 03/015182 | 2/2003 |

OTHER PUBLICATIONS

Yang-Kyu Choi et al., "Sub-20nm CMOS FinFET Technologies," 2001 IEEE, IEDM, pp. 421-424.

Xuejue Huang et al., "Sub-50 nm P-Channel FinFET," IEEE Transactions on Electron Devices, vol. 48, No. 5, May 2001, pp. 880-886.

Xuejue Huang et al., "Sub 50-nm FinFET: PMOS," 1999 IEEE, IEDM, pp. 67-70.

Yang-Kyu Choi et al., "Nanoscale CMOS Spacer FinFET for the Terabit Era," IEEE Electron Device Letters, vol. 23, No. 1, Jan. 2002, pp. 25-27.

Co-pending U.S. Appl. No. 10/320,536, filed Dec. 17, 2002 entitled: "FinFET Gate Formation Using Reverse Trim of Dummy Gate," 14 page specification, 11 sheets of drawings.

Co-pending U.S. Appl. No. 10/459,589, filed Jun. 12, 2003 entitled: "FinFET Gate Formation Using Reverse Trim and Oxide Polish," 17 page specification, 28 sheets of drawings.

Co-pending U.S. Appl. No. 10/310,777, filed Dec. 6, 2002 entitled: "Damascene Gate Process with Sacrificial Oxide in Semiconductor Devices," 19 page specification, 10sheets of drawings.

Co-pending U.S. Appl. No. 10/645,577, filed Aug. 22, 2003 entitled: "Sacrificial Oxide Protection During Dummy Gate Removal in Damascene Gate Process in Semiconductor Devices," 19 page specification, 9sheets of drawings.

Stephen H. Tang et al., "Comparison of Short-Channel Effect and Offstate Leakage in Symmetric vs. Asymmetric Double Gate MOSFETs", IEEE International SOI Conference, Oct. 2000, pp. 120-121.

Co-pending U.S. Appl. No. 10/720,166, filed Nov. 25, 2003 entitled: "Damascene Gate Process with Sacrificial Oxide in Semiconductor"; 19 page specification, 10 sheets of drawings.

Co-pending U.S. Appl. No. 10/838,228, filed May 5, 2004 entitled: "Sacrificial Oxide for Minimizing Box Undercut in Damascene FinFet"; 15 page specification, 12 sheets of drawings.

* cited by examiner

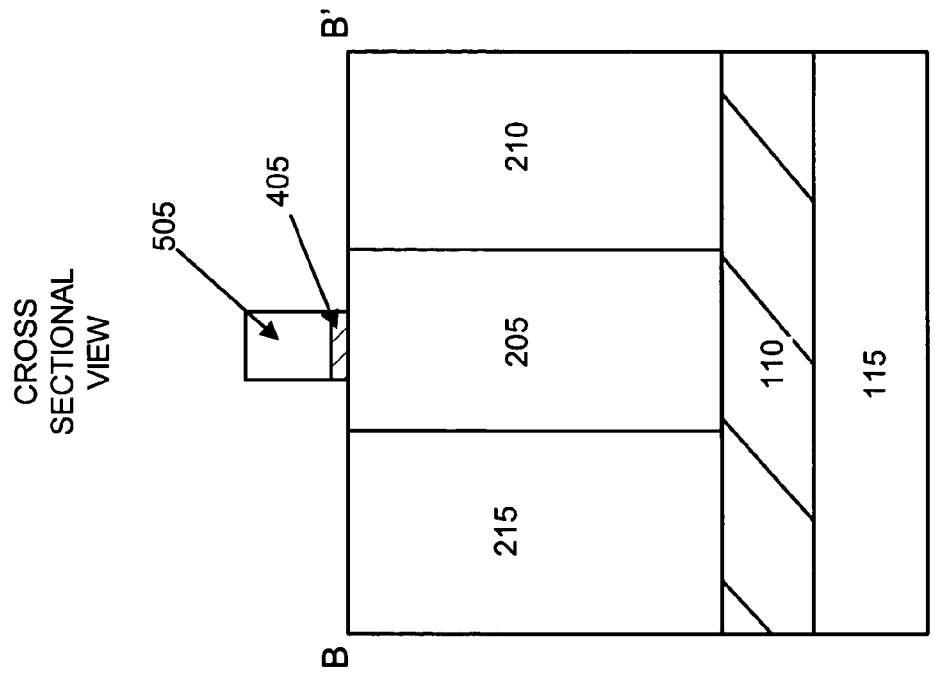
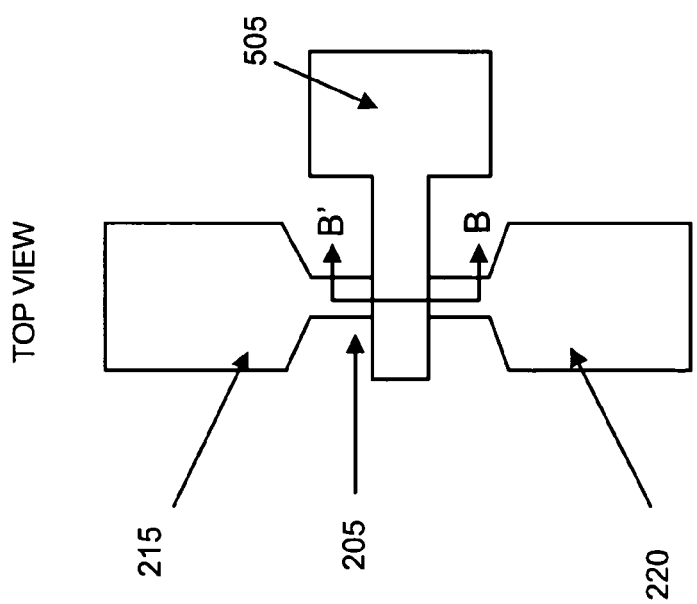
FIG. 5B
FIG. 5A

US 7,041,542 B2

DAMASCENE TRI-GATE FINFET

TECHNICAL FIELD

The present invention relates generally to transistors and, more particularly, to fin field effect transistors (FinFETs).

BACKGROUND ART

The escalating demands for high density and performance associated with ultra large scale integration semiconductor devices require design features, such as gate lengths, below 100 nanometers (nm), high reliability and increased manufacturing throughput. The reduction of design features below 100 nm challenges the limitations of conventional methodology.

For example, when the gate length of conventional planar metal oxide semiconductor field effect transistors (MOSFETs) is scaled below 100 nm, problems associated with short channel effects, such as excessive leakage between the source and drain, become increasingly difficult to overcome. In addition, mobility degradation and a number of process issues also make it difficult to scale conventional MOSFETs to include increasingly smaller device features. New device structures are, therefore, being explored to improve FET performance and allow further device scaling.

Double-gate MOSFETs represent structures that have been considered as candidates for succeeding existing planar MOSFETs. In double-gate MOSFETs, two gates may be used to control short channel effects. A FinFET is a recent double-gate structure that exhibits good short channel behavior. A FinFET includes a channel formed in a vertical fin. The FinFET structure may be fabricated using layout and process techniques similar to those used for conventional planar MOSFETs.

DISCLOSURE OF THE INVENTION

Implementations consistent with the present invention provide a tri-gate FinFET formed using, for example, a damascene process. A tri-gate FinFET will have better short-channel control than double-gate and single-gate devices, and will have higher drive current than a double-gate finFET for the same area. The metal tri-gate, formed in a damascene process consistent with the invention, may be used to reduce poly depletion effects and gate resistance.

Additional advantages and other features of the invention will be set forth in part in the description which follows and, in part, will become apparent to those having ordinary skill in the art upon examination of the following, or may be learned from the practice of the invention. The advantages and features of the invention may be realized and obtained as particularly pointed out in the appended claims.

According to the present invention, the foregoing and other advantages are achieved in part by a method of forming a fin field effect transistor that includes forming a fin and forming a source region adjacent a first end of the fin and a drain region adjacent a second end of the fin. The method further includes forming a dummy gate comprising a first material in a first pattern over the fin and forming a dielectric layer adjacent sides of the dummy gate. The method also includes removing the first material to form a trench in the dielectric layer corresponding to the first pattern and forming a metal gate in the trench.

According to another aspect of the invention, a tri-gate fin field effect transistor is provided. The tri-gate fin field effect transistor includes a fin that further includes multiple surfaces and has a source region and a drain region formed adjacent each end of the fin. The tri-gate fin field effect transistor further includes a metal gate formed on three surfaces of the multiple surfaces.

According to an additional aspect of the invention, a method of forming a fin field effect transistor includes forming a fin and forming a source region adjacent a first end of the fin and a drain region adjacent a second end of the fin. The method further includes forming a dummy oxide layer over the fin, depositing a layer of first material over the fin and dummy oxide layer, and etching the layer of the first material to form a dummy gate in a first pattern. The method also includes depositing a dielectric layer over the dummy gate and source and drain regions, planarizing the dielectric layer to expose a top surface of the dummy gate, and removing the first material to form a trench in the dielectric layer corresponding to the first pattern. The method additionally includes forming a gate insulation layer in the trench and forming a metal gate in the trench.

Other advantages and features of the present invention will become readily apparent to those skilled in this art from the following detailed description. The embodiments shown and described provide illustration of the best mode contemplated for carrying out the invention. The invention is capable of modifications in various obvious respects, all without departing from the invention. Accordingly, the drawings are to be regarded as illustrative in nature, and not as restrictive.

BRIEF DESCRIPTION OF THE DRAWINGS

Reference is made to the attached drawings, wherein elements having the same reference number designation may represent like elements throughout.

FIGS. 5A and 5B illustrate the formation of a dummy gate from the polysilicon layer of FIG. 4B consistent with the invention;

BEST MODE FOR CARRYING OUT THE INVENTION

The following detailed description of the invention refers to the accompanying drawings. The same reference numbers in different drawings may identify the same or similar elements. Also, the following detailed description does not limit the invention. Instead, the scope of the invention is defined by the appended claims.

Consistent with the present invention, an exemplary damascene process for forming a tri-gate FinFET is provided. In the exemplary damascene process, a dummy gate may be formed from a layer of semi-conducting material, such as, for example, polysilicon, that has been formed over a fin. A dielectric layer may then be formed over the FinFET fin, source and drain regions around the dummy gate. The dummy gate may then be removed to create a gate trench in the dielectric layer. A metal gate that contacts three surfaces of the fin may then be formed in the created gate trench to complete the damascene process.

Figure 1:
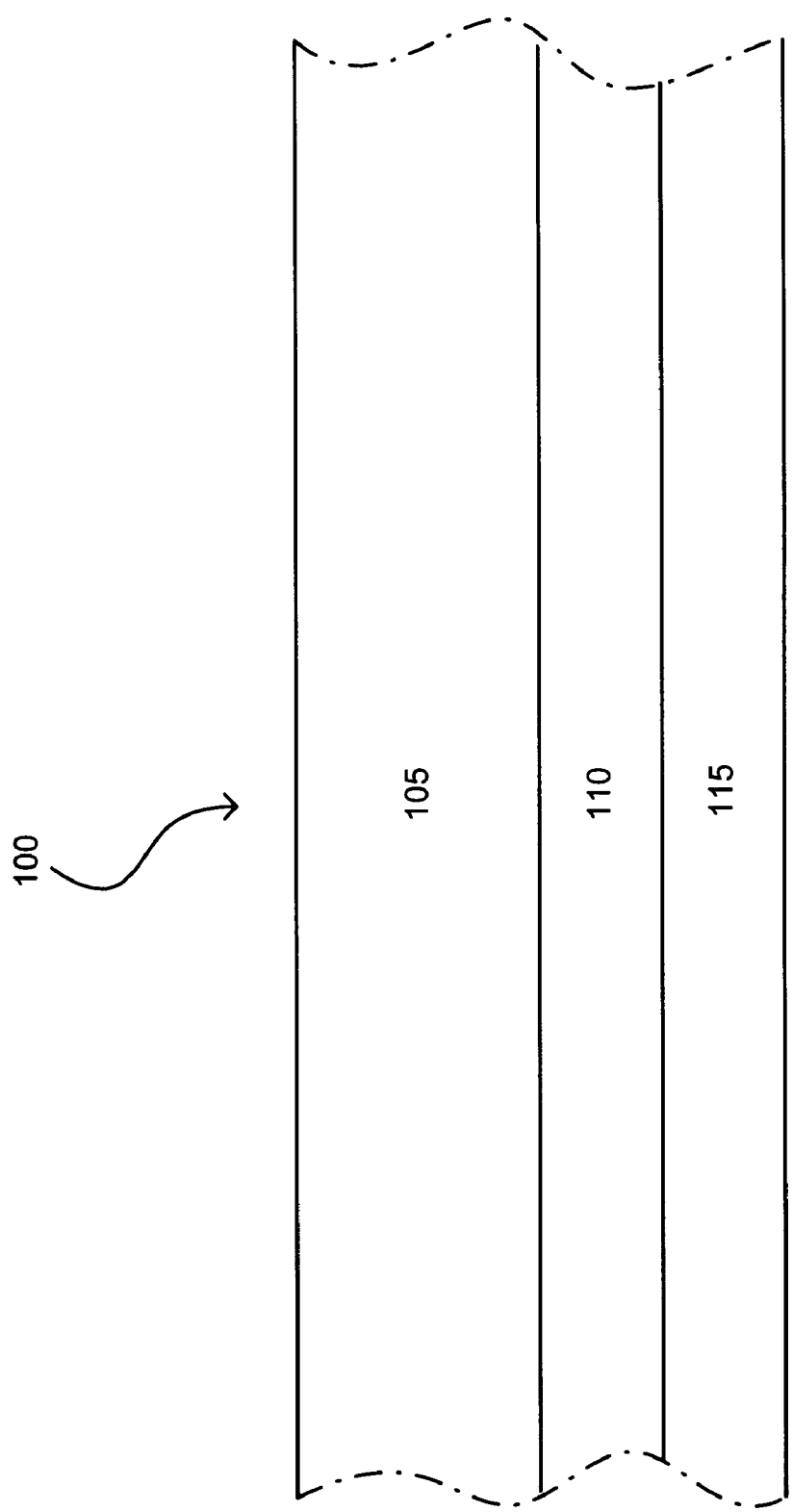
FIG. 1 illustrates exemplary layers of a silicon-on-insulator (SOI) wafer that may be used for forming a fin of a FinFET consistent with the present invention.

FIG. 1 illustrates a cross-section of a silicon on insulator (SOI) wafer 100 formed in accordance with an exemplary embodiment of the present invention. SOI wafer 100, consistent with the present invention, may include a buried oxide layer 110 formed on a substrate 115. A fin layer 105 may further be formed on buried oxide layer 110. The thickness of fin layer 105 may range, for example, from about 500 Å to about 2000 Å and the thickness of buried oxide layer 110 may range, for example, from about 1000 Å to about 3000 Å. Fin layer 105 and substrate 115 may include, for example, silicon, though other semi-conducting materials, such as germanium, may be used.

Figure 2A:
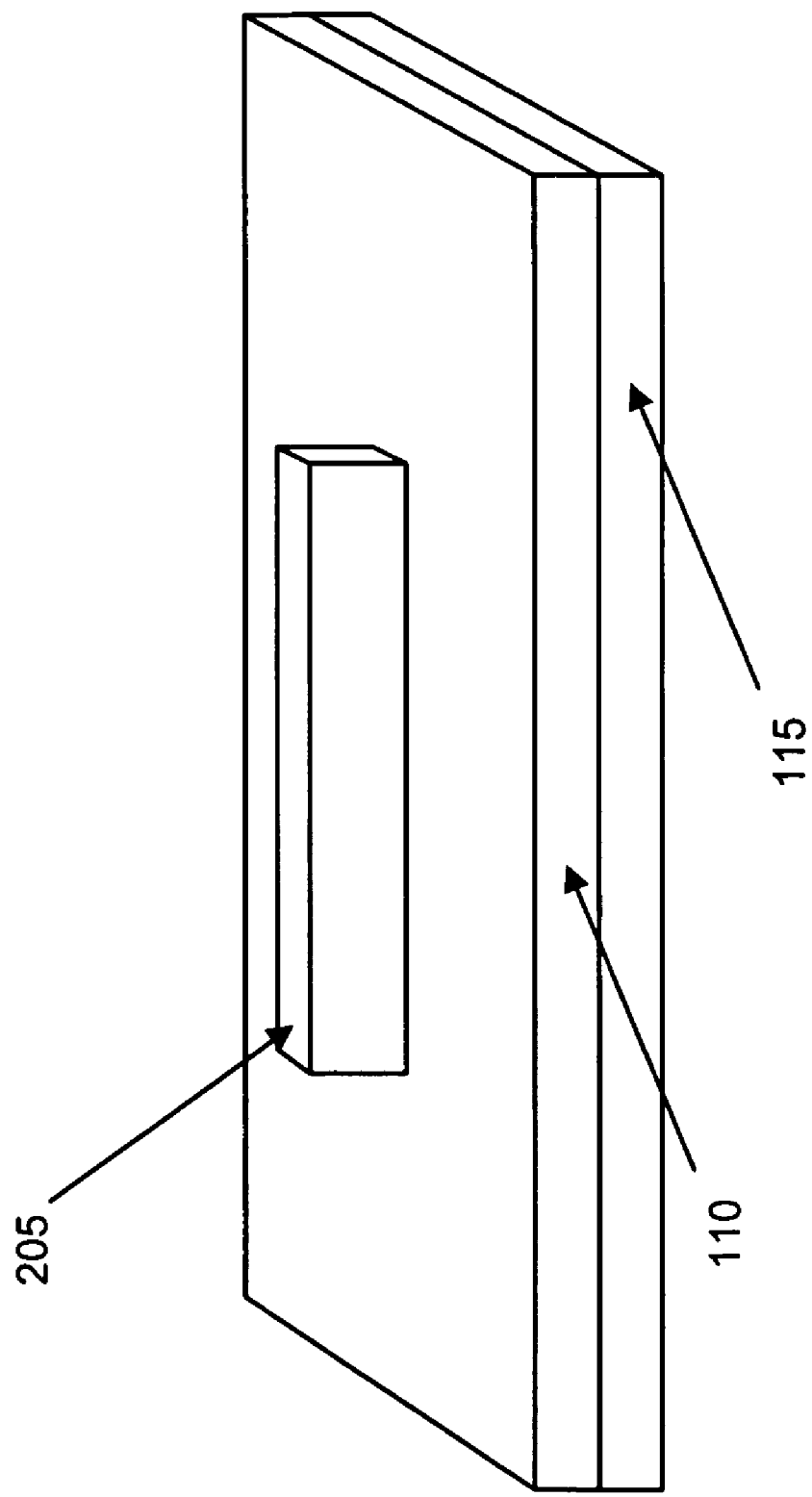
FIG. 2A illustrates an exemplary fin consistent with the invention.
Figure 2D:
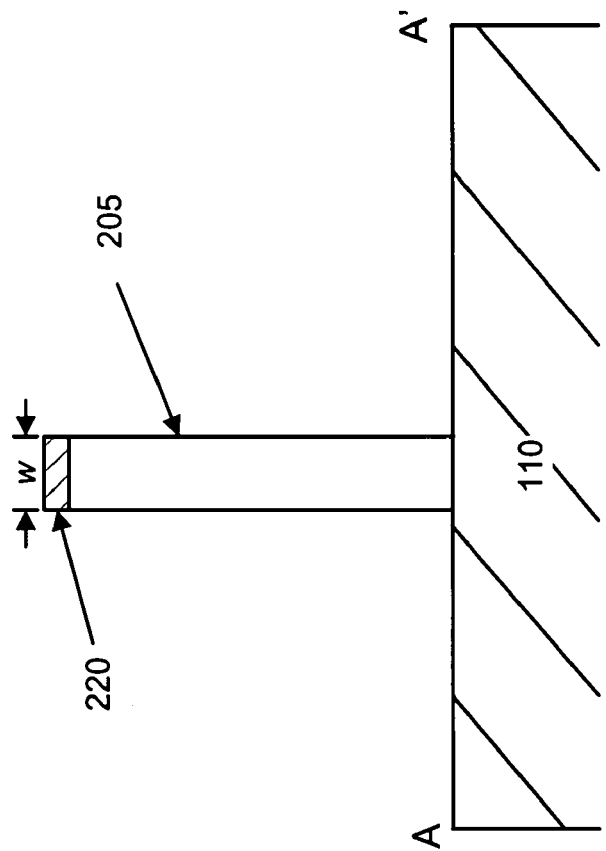
FIG. 2D illustrates a cross-sectional view of the exemplary fin of FIG. 2A consistent with the invention.

As shown in FIGS. 2A and 2D, a vertical fin 205 may be formed from fin layer 105. Fin 205 may be formed, for example, with a width (w) in a range of 10–50 nm. Fin 205 may be formed from fin layer 105 using any conventional process, including, but not limited to, conventional photolithographic and etching processes.

Figure 2B:
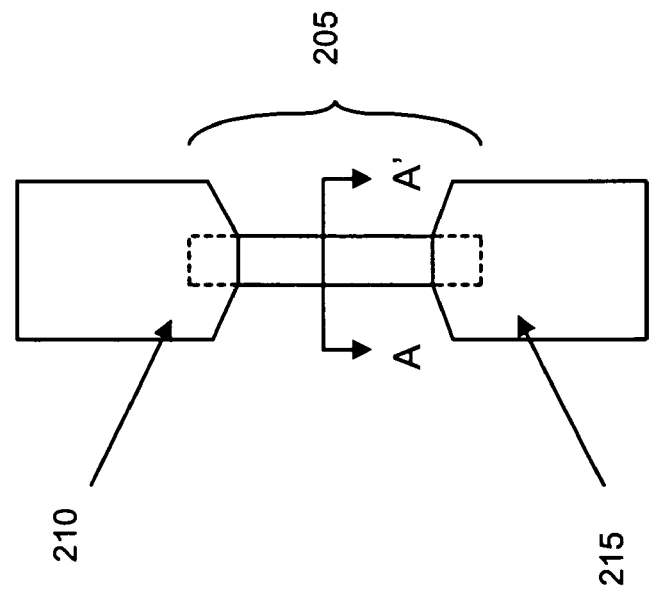
FIGS. 2B and 2C illustrate source and drain regions formed adjacent the fin of FIG. 2A consistent with the invention.
Figure 2C:
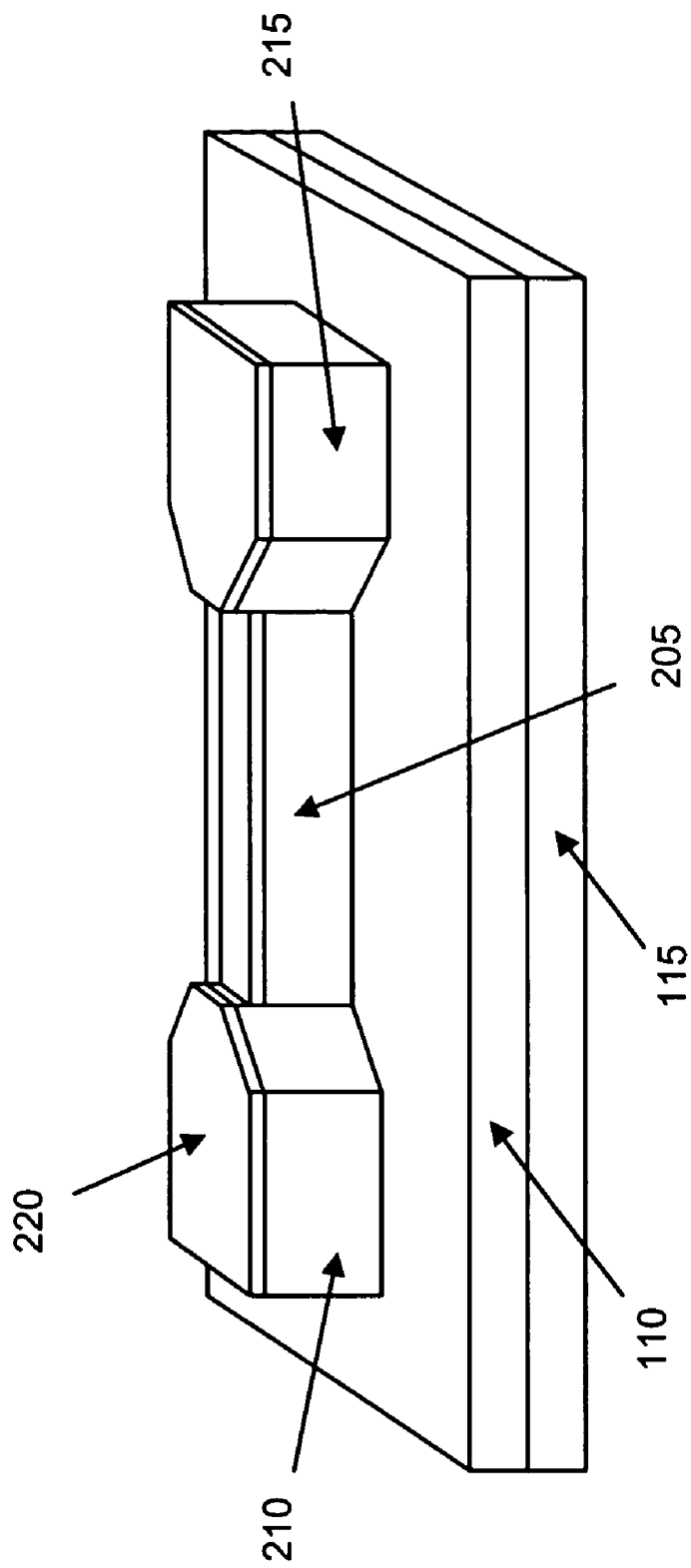

Subsequent to formation of fin 205, source 210 and drain 215 regions may be formed adjacent respective ends of fin 205, as shown in FIGS. 2B and 2C. Source 210 and drain 215 regions may be formed by, for example, deposition of a layer of semi-conducting material over fin 205. The source 210 and drain 215 regions may be formed from the layer of semi-conducting material using, for example, conventional photolithographic and etching processes. One skilled in the art will recognize, however, that other existing techniques may be used for forming source 210 and drain 215 regions. For example, source 210 and drain 215 regions may be formed by patterning and etching fin layer 105. Source 210 and drain 215 regions may include a semi-conducting material such as, for example, silicon, germanium or silicon-germanium (Si—Ge). In one implementation, $Si_xGe_{(1-x)}$, with x approximately equal to 0.7 may be used. A cap 220 may then be formed on upper surfaces of fin 205, source 210 and drain 215, as illustrated in FIG. 2D. Cap 220 may include an oxide, such as, for example, silicon oxide, and may range, for example, from about 150 Å to about 700 Å in thickness.

Figure 3A:
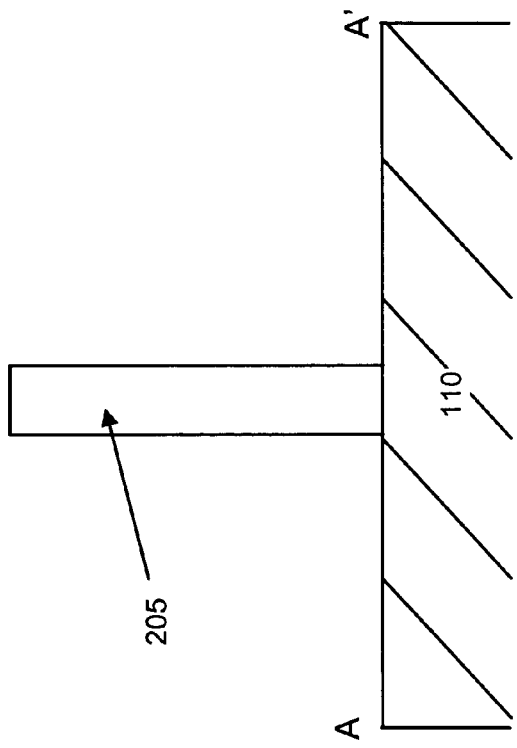
FIG. 3A illustrates a cross-sectional view of a layer of sacrificial oxide formed on the fin of FIG. 2A consistent with the invention.
Figure 3B:
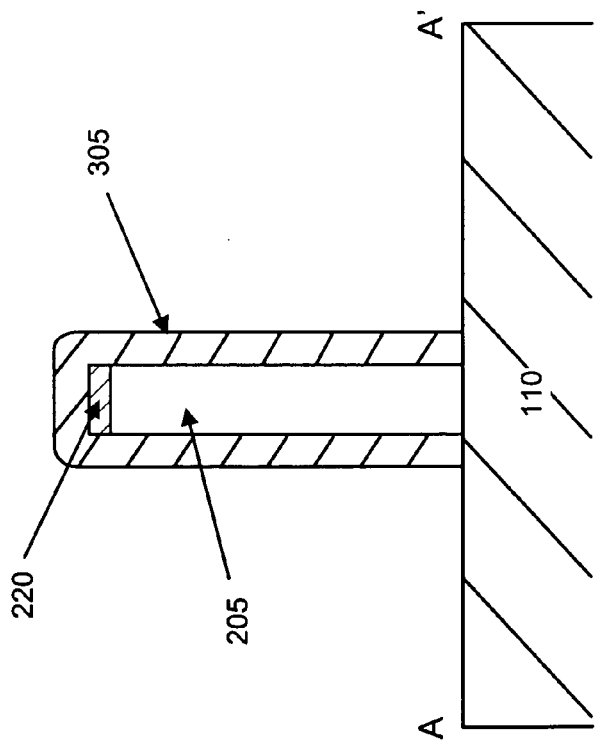
FIG. 3B illustrates a cross-sectional view of the removal of the sacrificial oxide of FIG. 3A consistent with the invention.

After formation of source 210 and drain 215 regions, a sacrificial oxide layer 305 may be formed on fin 205, source 210 and drain 215, as shown in FIG. 3A. Sacrificial oxide layer 305 may be formed on fin 205, source 210 and drain 215 using any appropriate conventional process. In some exemplary embodiments, for example, oxide layer 305 may be thermally grown on fin 205, source 210 and drain 215 to a thickness ranging from about 50 Å to about 150 Å. As shown in FIG. 3B, cap 210 and sacrificial oxide layer 305 may be removed using a conventional process, such as, for example, a conventional etching process to remove defects from sidewalls of fin 205.

Figure 4B:
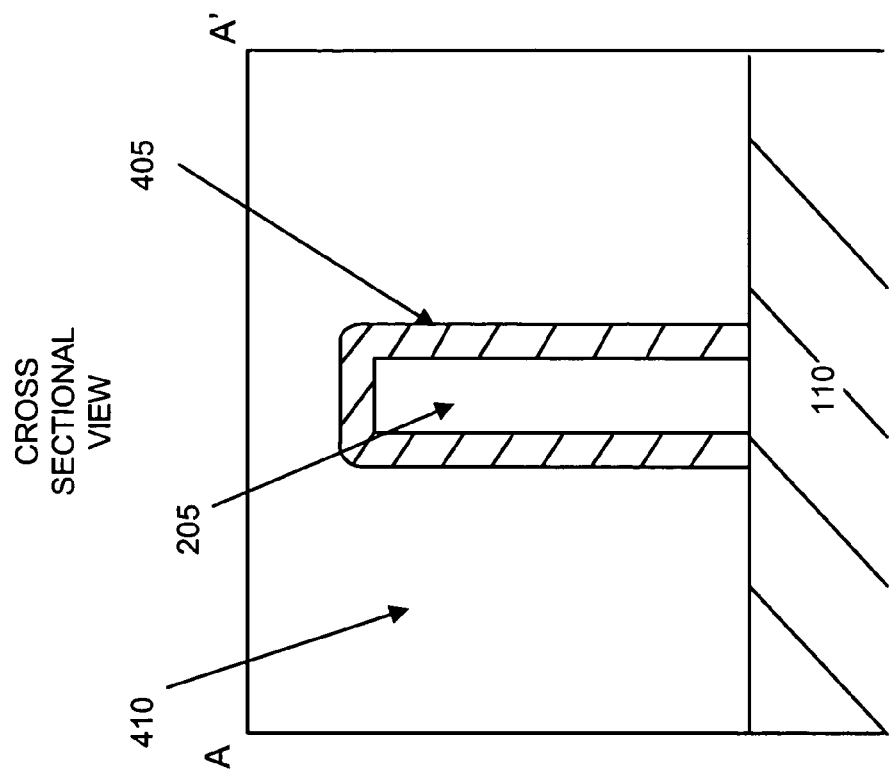
FIGS. 4A and 4B illustrate cross-sectional views of dummy oxide and a polysilicon layer formed on the fin of FIG. 3B consistent with the invention.
Figure 4A:
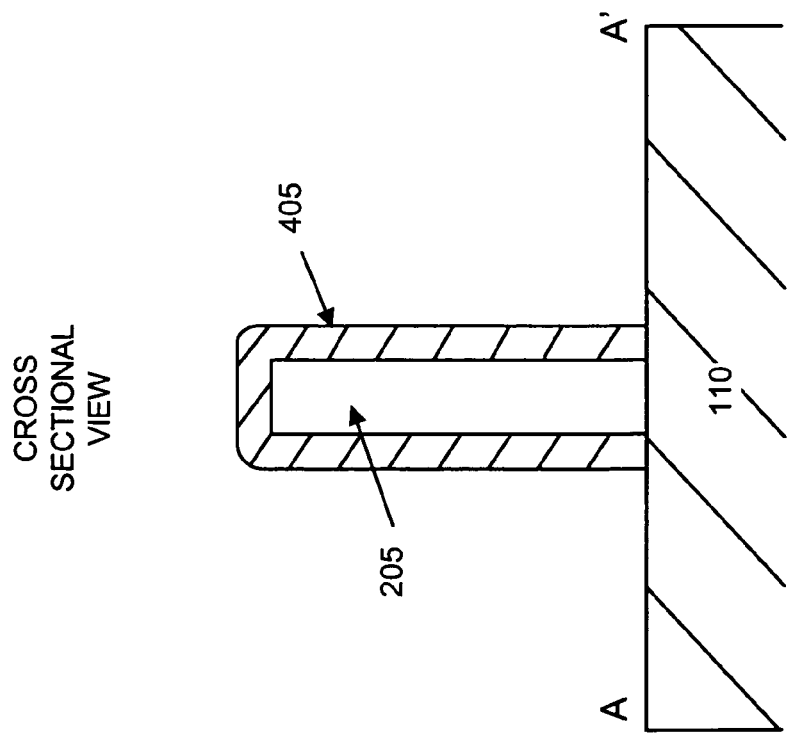

Dummy oxide 405 may be formed on fin 205, source 210 and drain 215 using a conventional process, as shown in FIG. 4A. Dummy oxide 405, for example, may be thermally grown on fin 205, source 210 and drain 215. Dummy oxide 405 may include an oxide, such as, for example, silicon oxide and may range, for example, from about 50 Å to about 150 Å in thickness. As further shown in FIG. 4B, a layer of polysilicon 410 may be formed over fin 205, source 210 and drain 215. The thickness of polysilicon layer 410 may range, for example, from about 700 Å to about 2000 Å. Polysilicon layer 410 may be polished back using, for example, a chemical-mechanical polishing (CM) process, to achieve a planar surface to improve subsequent gate lithography. As shown in FIGS. 5A and 5B, a dummy gate 505 may be defined in polysilicon layer 410 using a conventional process, such as, for example, a conventional patterning and etching process.

Figure 6:
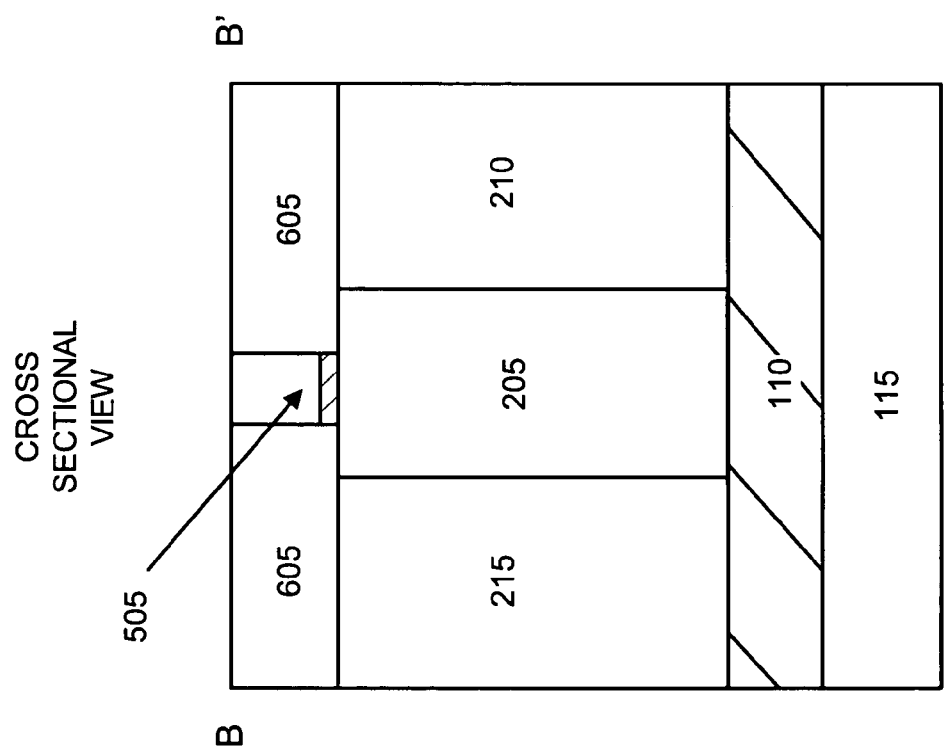
FIG. 6 illustrates the formation of a dielectric layer adjacent the dummy gate of FIGS. 5A and 5B consistent with the present invention.

As shown in FIG. 6, a dielectric layer 605 may be formed over dummy gate 505 using, for example, conventional deposition processes. Dielectric layer 605 may include, for example, tetraethylorthosilicate (TEOS), or any other dielectric material. The thickness of dielectric layer 605 may range, for example, from about 1000 Å to about 2500 Å. Dielectric layer 605 may then be polished back to the upper surface of dummy gate 505 using, for example, a CMP process, as illustrated in FIG. 6.

Figure 8:
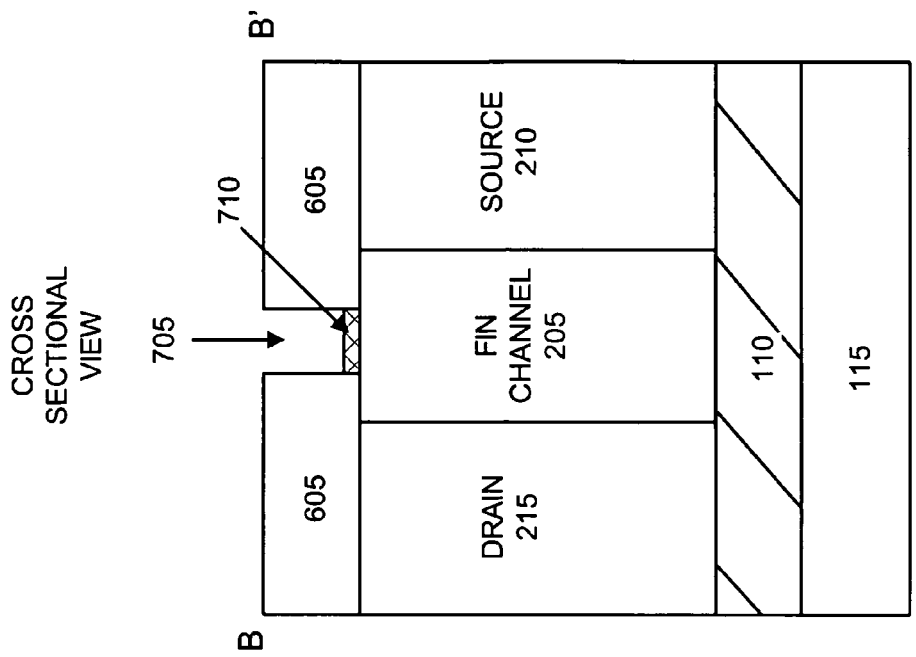
FIG. 8 illustrates formation of gate insulation within the gate trench of FIG. 7 consistent with the present invention.
Figure 7:
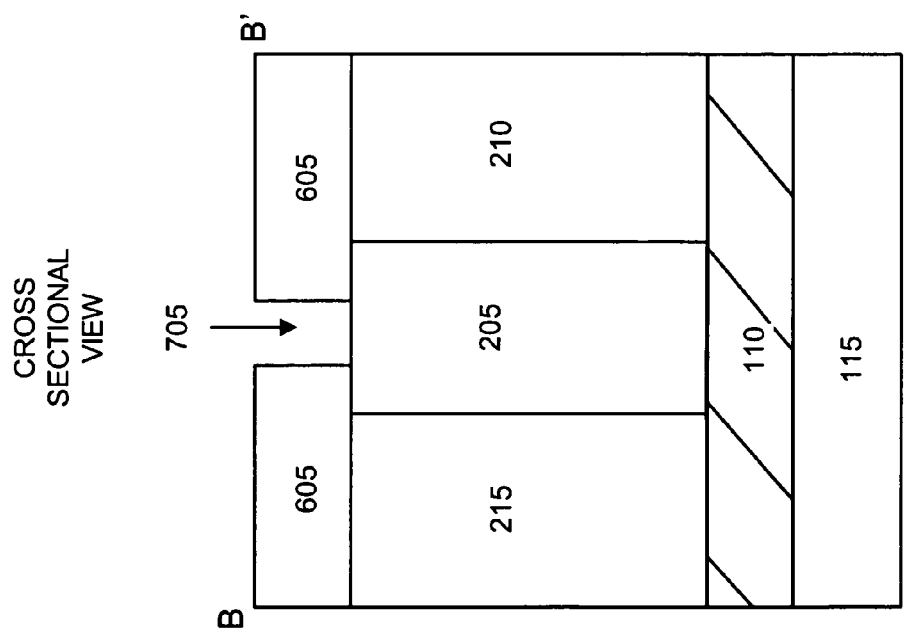
FIG. 7 illustrates the removal of the dummy gate of FIGS. 5A and 5B to form a gate trench consistent with the present invention.

Dummy gate 505 and dummy oxide 405 may then be removed, as shown in FIG. 7, leaving a gate trench 705. Dummy gate 505 and dummy oxide 405 may be removed using, for example, conventional etching processes. Gate insulation 710 may then be formed in gate trench 705, as shown in FIG. 8. Gate insulation 710 may be thermally grown or deposited using conventional deposition processes. Gate insulation 710 may include SiO, $SiO_2$, SiN, SiON, $HFO_2$, $ZrO_2$, $Al_2O_3$, HFSiO(x) ZnS, $MgF_2$, or other high-K dielectric materials.

Figure 9B:
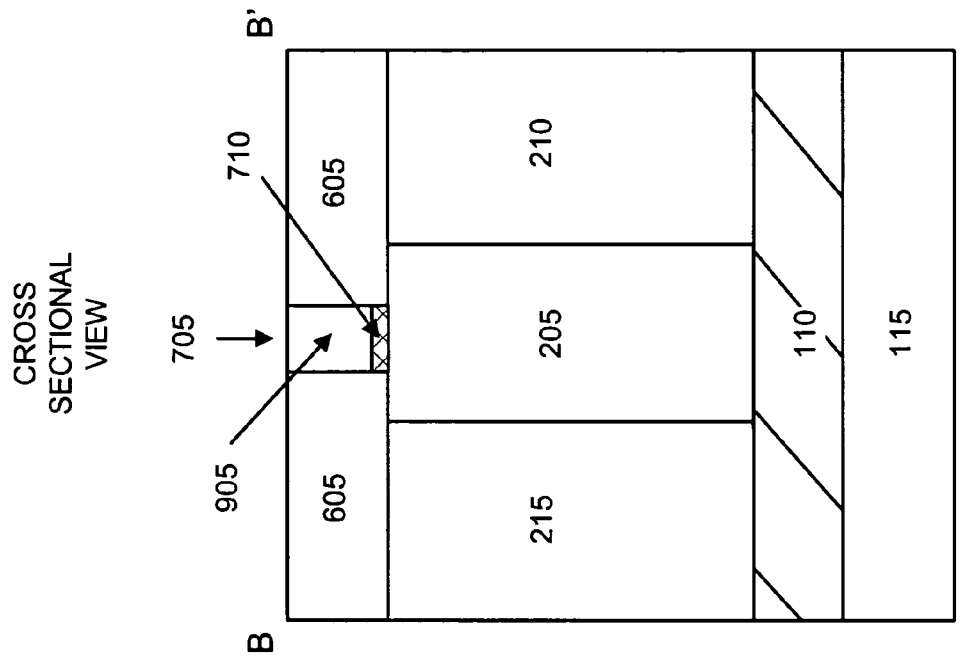
FIGS. 9A, 9B and 9C illustrate formation of a metal tri-gate within the gate trench of FIG. 8 consistent with the present invention.
Figure 9A:
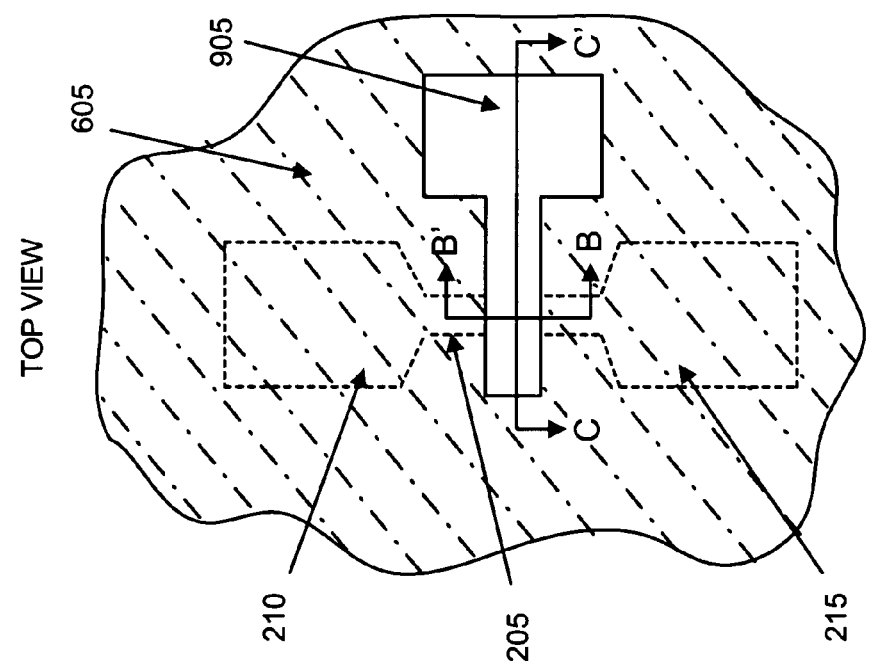
Figure 9C:
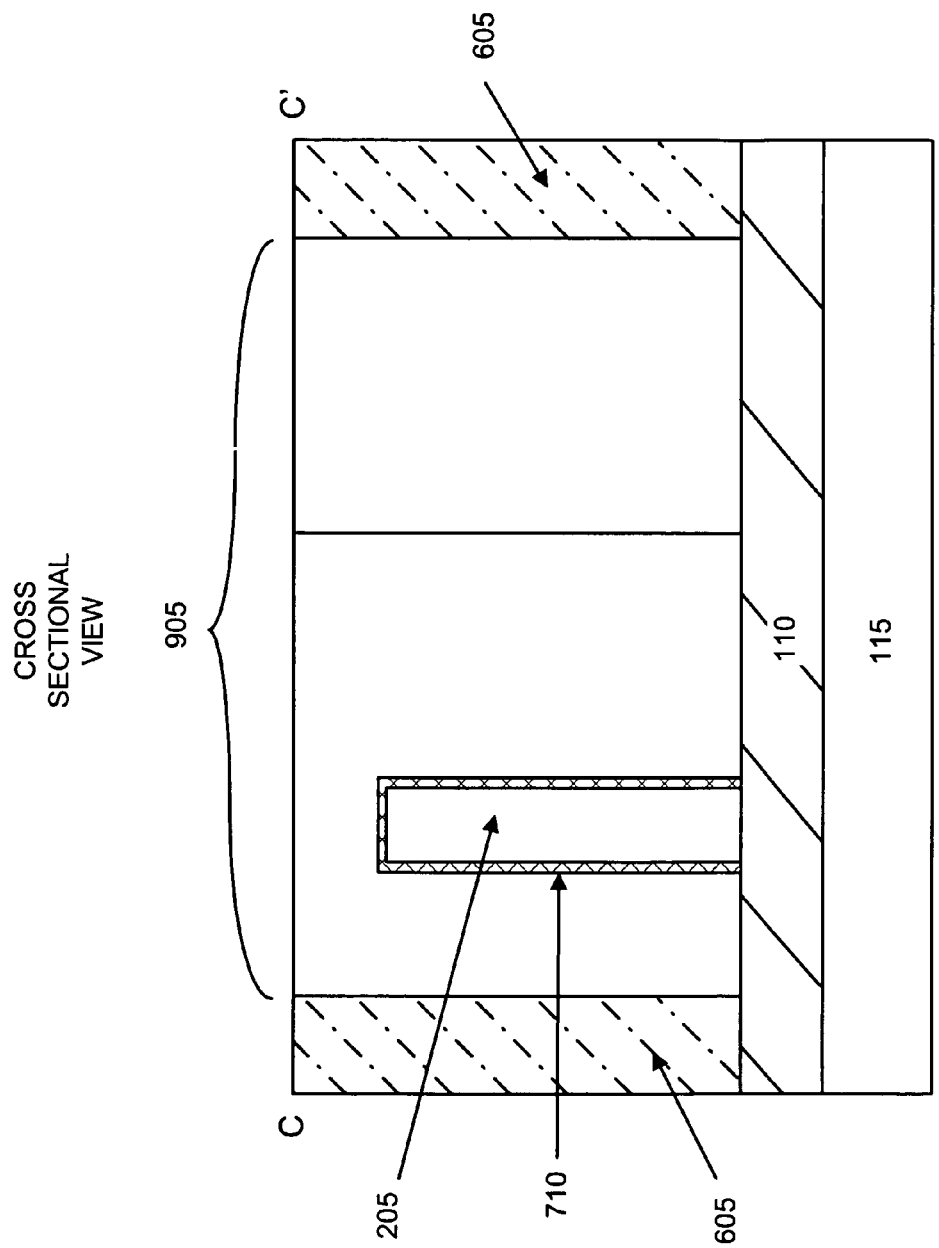

As shown in FIGS. 9A, 9B and 9C, a metal gate 905 may be formed in gate trench 705 over gate insulation 710. Metal gate 905 may be formed in gate trench 705 using a conventional metal deposition process and polished back to the upper surface of dielectric layer 605. Metal gate 905 may include a metal material, such as, for example, TaN or TiN, though other metal materials may be used. As shown in FIG. 9C, the resulting metal gate 905 is disposed on all three sides of fin 205, thus, producing a tri-gate FinFET. The tri-gate FinFET, consistent with the invention, will have better short-channel control than double-gate and single-gate devices. The tri-gate FinFET also has higher drive current than a double-gate FinFET for the same area. The metal gate 905 of the tri-gate FinFET also reduces poly depletion effects and gate resistance.

Exemplary Self-Stopping Poly Planarization

Figure 11:
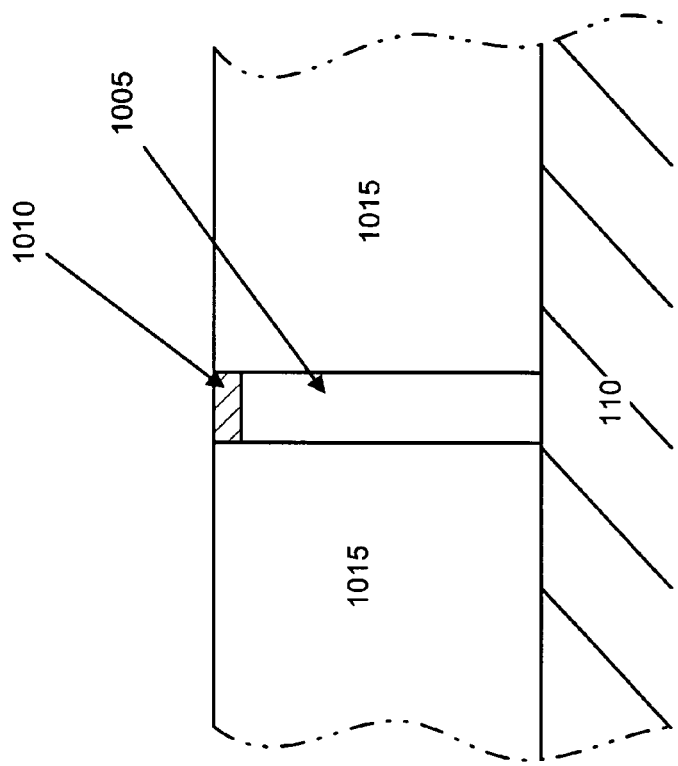
FIG. 11 illustrates planarization of the polysilicon layer of FIG. 10 consistent with another embodiment of the invention.
Figure 10:
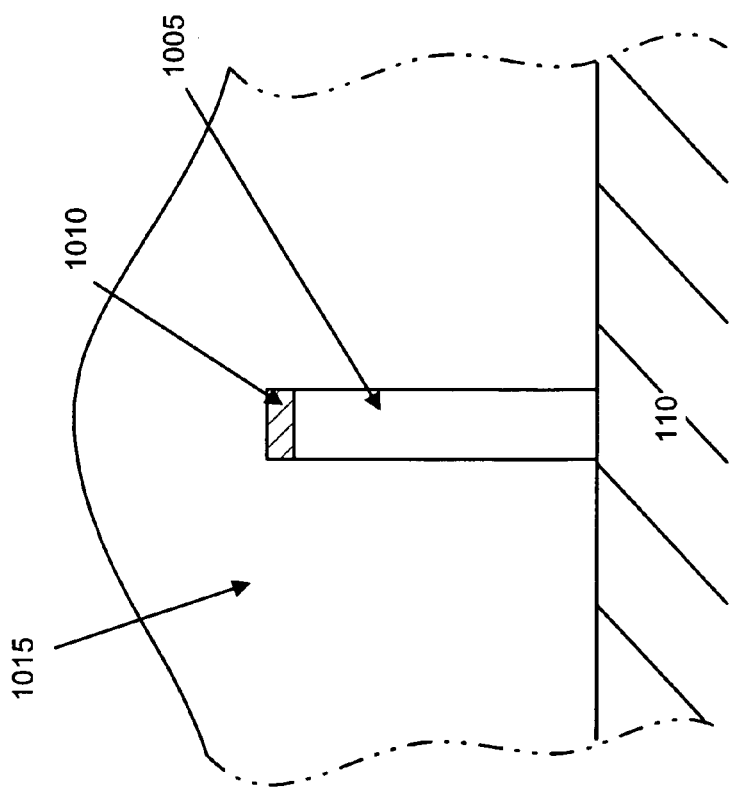
FIG. 10 illustrates formation of a polysilicon layer over a fin consistent with another embodiment of the invention.

FIGS. 10–13 illustrate an exemplary self stopping poly planarization process for forming a FinFET, consistent with another embodiment of the present invention, that leaves the FinFET gates connected after planarization. As shown in FIG. 10, the exemplary process may begin with the deposition of a thin layer of oxide or nitride on a fin 1005. Fin 1005 may be formed in accordance with the exemplary process described above with respect to FIGS. 1 and 2. The thin layer may include an oxide or nitride material and may range, for example, from about 150 Å to about 700 Å in thickness. Subsequent to deposition of the thin layer of oxide or nitride, the layer may be patterned and etched, using conventional processes, to produce a cap 1010 on fin 1005. A layer of polysilicon 1015 may then be formed over cap 1010 and fin 1005 using, for example, conventional deposition processes. As shown in FIG. 11, the layer of polysilicon 1015 may be planarized back to an upper surface of cap 1010 using, for example, a highly selective poly to oxide CMP process. Cap 1010 may function as a polish stop layer. Polysilicon layer 1015 may function as the gate material.

Figure 13:
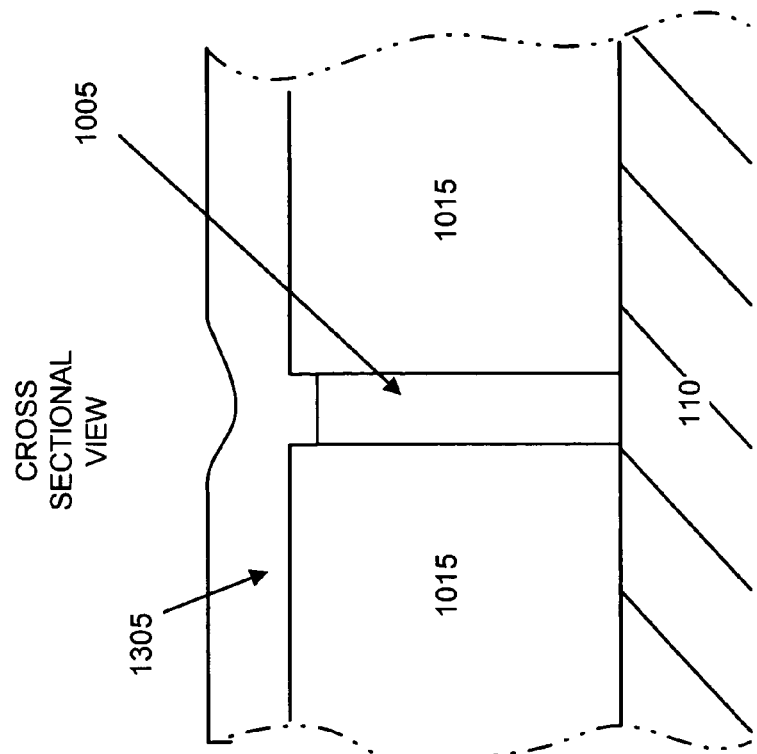
FIG. 13 illustrates formation of a layer of polysilicon, with controlled thickness, over the fin and planarized polysilicon layer of FIG. 12 consistent with another embodiment of the invention.
Figure 12:
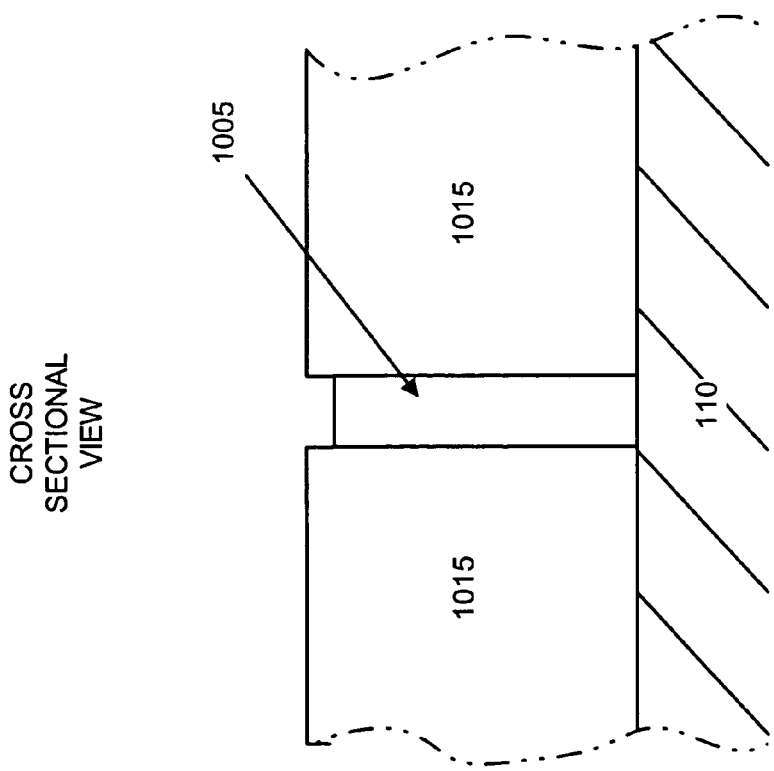
FIG. 12 illustrates removal of the cap of FIG. 11 consistent with another embodiment of the invention.

Cap 1010 may then be stripped using, for example, a conventional etching process, as shown in FIG. 12. A uniformly thin layer of polysilicon 1305 may then be formed over fin 1005 and planarized polysilicon layer 1015, as shown in FIG. 13, using conventional deposition processes. Using the above exemplary process, the thickness of the polysilicon 1305 over fin 1005 may be carefully controlled. Polysilicon 1305 may connect the gates located on either said of fin 1005.

In the previous descriptions, numerous specific details are set forth, such as specific materials, structures, chemicals, processes, etc., in order to provide a thorough understanding of the present invention. However, the present invention can be practiced without resorting to the details specifically set forth herein. In other instances, well known processing structures have not been described in detail, in order not to unnecessarily obscure the thrust of the present invention. In practicing the present invention, conventional photolithographic, etching and deposition techniques may be employed, and hence, the details of such techniques have not been set forth herein in detail.

Only the preferred embodiments of the invention and a few examples of its versatility are shown and described in the present disclosure. It is to be understood that the invention is capable of use in various other combinations and environments and is capable of modifications within the scope of the inventive concept as expressed herein.

What is claimed is:

1. A method of forming a fin field effect transistor, comprising:
    forming a fin;
    forming a source region adjacent a first end of the fin and a drain region adjacent a second end of the fin;
    forming an oxide cap over upper surfaces of the fin, source region, and drain region;
    forming a layer of sacrificial oxide on the fin, source region and drain region after formation of the oxide cap;
    removing the layer of sacrificial oxide to remove defects from surfaces of the fin;
    forming a dummy gate comprising a first material in a first pattern over the fin;
    forming a dielectric layer adjacent sides of the dummy gate;
    removing the first material to form a trench in the dielectric layer corresponding to the first pattern;
    forming a layer of gate insulation on the surfaces of the fin exposed within the trench; and
    forming a metal gate in the trench over the layer of gate insulation.

2. The method of claim 1, wherein the metal gate contacts at least three of the surfaces of the fin.

3. The method of claim 2, wherein the fin field effect transistor comprises a tri-gate fin field effect transistor.

4. The method of claim 1, wherein the dielectric layer comprises tetraethylorthosilicate.

5. The method of claim 1, wherein the gate insulation layer comprises at least one of SiO, $SiO_2$, SiN, SiON, $HFO_2$, $ZrO_2$, $Al_2O_3$, HFSiO(x)ZnS, and $MgF_2$.

6. The method of claim 1, wherein the first material comprises polysilicon.

7. The method of claim 1, further comprising:
    forming a dummy oxide layer over the fin prior to forming the dummy gate.

8. The method of claim 7, wherein forming the dummy gate comprises:
    depositing a layer of the first material over the fin; and
    etching the layer of the first material to form the dummy gate in the first pattern.

9. The method of claim 1, wherein forming the metal gate comprises:
    depositing a metal material to fill the trench.

10. A method of forming a fin field effect transistor, comprising:
    forming a fin;
    forming a source region adjacent a first end of the fin and a drain region adjacent a second end of the fin;
    forming an oxide cap over upper surfaces of the fin, source region, and drain region;
    forming a layer of sacrificial oxide on the fin, source region and drain region after formation of the oxide cap;
    removing the layer of sacrificial oxide to remove defects from surfaces of the fin;
    forming a dummy oxide layer over the fin;
    depositing a layer of first material over the fin and dummy oxide layer;
    etching the layer of the first material to form a dummy gate in a first pattern;
    depositing a dielectric layer over the dummy gate and source and drain regions;
    planarizing the dielectric layer to expose a top surface of the dummy gate;
    removing the first material to form a trench in the dielectric layer corresponding to the first pattern;
    forming a gate insulation layer in the trench on the surfaces of the fin exposed within the trench; and
    forming a metal gate in the trench over the gate insulation layer.

11. The method of claim 10, wherein the metal gate contacts at least three of the surfaces of the fin.

12. The method of claim 10, wherein the fin field effect transistor comprises a tri-gate fin field effect transistor.

13. The method of claim 10, wherein the dielectric layer comprises tetraethylorthosilicate.

14. The method of claim 10, wherein the first material comprises polysilicon.

15. The method of claim 1, wherein forming the metal gate comprises:
    depositing a metal material to fill the trench.

16. The method of claim 1, wherein forming the layer of sacrificial oxide comprises:
    thermally growing the layer of sacrificial oxide, and wherein removing the layer of sacrificial oxide to remove defects from sidewalls of the fin comprises:
    etching the layer of sacrificial oxide.

* * * * *